United States Patent
Bhuyan et al.

(10) Patent No.: US 12,031,209 B2
(45) Date of Patent: Jul. 9, 2024

(54) REDUCING AGENTS FOR ATOMIC LAYER DEPOSITION

(71) Applicant: Applied Materials, Inc., Santa Clara, CA (US)

(72) Inventors: Bhaskar Jyoti Bhuyan, San Jose, CA (US); Mark Saly, Santa Clara, CA (US); Lakmal C. Kalutarage, San Jose, CA (US); Thomas Knisley, Livonia, MI (US)

(73) Assignee: Applied Materials, Inc., Santa Clara, CA (US)

( * ) Notice: Subject to any disclaimer, the term of this patent is extended or adjusted under 35 U.S.C. 154(b) by 621 days.

(21) Appl. No.: 17/176,984

(22) Filed: Feb. 16, 2021

(65) Prior Publication Data

US 2022/0259734 A1    Aug. 18, 2022

(51) Int. Cl.
| | |
|---|---|
| *C23C 16/18* | (2006.01) |
| *C07F 7/00* | (2006.01) |
| *C07F 7/02* | (2006.01) |
| *C07F 7/22* | (2006.01) |
| *C07F 7/30* | (2006.01) |
| *C23C 16/455* | (2006.01) |

(52) U.S. Cl.
CPC ........ *C23C 16/45553* (2013.01); *C07F 7/003* (2013.01); *C07F 7/025* (2013.01); *C07F 7/2224* (2013.01); *C07F 7/2284* (2013.01); *C07F 7/30* (2013.01); *C23C 16/18* (2013.01); *C23C 16/45534* (2013.01)

(58) Field of Classification Search
CPC ... C23C 16/08; C23C 16/18; C23C 16/45534; C23C 16/45553; C07F 7/003; C07F 7/2224; C07F 7/2284
See application file for complete search history.

(56) References Cited

U.S. PATENT DOCUMENTS

| | | | |
|---|---|---|---|
| 9,443,736 B2 | 9/2016 | Cameron et al. | |
| 2004/0087143 A1 | 5/2004 | Norman et al. | |
| 2015/0004316 A1* | 1/2015 | Thompson | ........ C23C 16/45553 427/253 |
| 2019/0144998 A1* | 5/2019 | Abels | ...................... C23C 16/18 438/785 |
| 2021/0123136 A1* | 4/2021 | Kalutarage | ....... H01L 21/76843 |

FOREIGN PATENT DOCUMENTS

| | | |
|---|---|---|
| WO | 2008057616 A2 | 5/2008 |
| WO | 2012067439 A2 | 5/2012 |
| WO | 2016143456 A1 | 9/2016 |

OTHER PUBLICATIONS

Blakeney, Kyle J., et al., "Atomic Layer Deposition of Aluminum Metal Films Using a Thermally Stable Aluminum Hydride Reducing Agent", Chem. Mater. 2018, 30, 1844-1848.

(Continued)

*Primary Examiner* — Elizabeth A Burkhart
(74) *Attorney, Agent, or Firm* — Servilla Whitney LLC

(57) ABSTRACT

Methods of forming a metal film having a metal halide with a reducing agent are disclosed. The reducing agent, the reducing agent includes a group IV element containing heterocyclic compound, a radical initiator, an alkly alane, a diborene species and/or a Sn(II) compound.

16 Claims, 2 Drawing Sheets

(56) References Cited

OTHER PUBLICATIONS

Kim, Sang Bok, et al., "Synthesis of N-Heterocyclic Stannylene (Sn(II)) and Germylene (Ge(II)) and a Sn(II) Amidinate and Their Application as Precursors for Atomic Layer Deposition", Chem. Mater. 2014, 26, 3065-3073.
Moser, Daniel F., et al., "Formation of Disilanes in the Reaction of Stable Silylenes with Halocarbons", J. Am. Chem. Soc. 2005, 127, 14730-14738.
Narasimhan, S., et al., "Zirconium Borohydride—a Versatile Reducing Agent for the Reduction of Electrophilic and Nucleophilic Substrates", Zirconium Borohydride—a Versatile Reducing Agent for the Reduction of Electrophilic and Nucleophilic Substrates.
Rice, Gary W., et al., "Zirconium Borohydride as a Zirconium Boride Precursor", J. Am. Ceram. Soc., 71 141 C-181-C-183 (1988).
Schrock, Richard R., et al., "Synthesis and Decomposition of Alkyl Complexes of Molybdenum(IV) That Contain a [(Me3SiNCH2CH2)3N]3-Ligand. Direct Detection of R-Elimination Processes That Are More than Six Orders of Magnitude Faster than a-Elimination Processes", J. Am. Chem. Soc. 1997, 119, 11876-11893.
PCT International Search Report and Written Opinion in PCT/US2022/016412 dated May 25, 2022, 12 pages.

\* cited by examiner

REDUCING AGENTS FOR ATOMIC LAYER DEPOSITION

FIELD

Embodiments of the disclosure generally relate to methods for forming a film on a substrate surface. In particular, embodiments of the disclosure are directed to reducing agents and methods for reducing a film and/or abstracting halogen impurities from a film.

BACKGROUND

Integrated circuits have evolved into complex devices that can include millions of transistors, capacitors, and resistors on a single chip. The evolution of chip designs continually requires greater circuit density. As circuit densities increase for next generation devices, the widths of interconnects, such as vias, trenches, contacts, gate structures, and other features, as well as the dielectric materials there between, decrease to 45 nm and 32 nm dimensions or below, whereas the thickness of the dielectric layer remain substantially constant, with the result of increasing the aspect ratios of the features. In order to enable fabrication of next generation devices and structures, three dimensional (3D) stacking of semiconductor chips is often utilized to improve performance of the devices. 3D stacking of semiconductor chips reduces wire lengths and keeps wiring delay low. In manufacturing, 3D stacking of semiconductor chips, stair-like structures are often utilized to allow multiple metal interconnects to be disposed thereon, forming high-density of vertical semiconductor chips. Accordingly, metal interconnects are integral part of the modern microelectronic devices.

Traditionally the metal interconnects are deposited by physical vapor deposition (PVD) techniques. However, as device dimensions shrink, there is a tremendous push for atomic layer deposition (ALD) of elemental metals and metalloid. ALD of metals are typically achieved by using a metal precursor pulse followed by a reducing agent pulse. Purity and properties of the ALD metal films depends on the reducing power of the reducing agent and reaction by products. Although a lot of reagents are known in the literature to reduce metal salts in solution phase, achieving a pure metal film using ALD is still a challenge due to lower volatility and limited literature on surface reactivity of these processes. For example, halogen impurities in an ALD metal film are more common because most of the ALD metal precursors have halogens. Accordingly, one way to achieve the pure metal film is by abstracting halogen impurities.

At present, hydrogen plasma is widely used in the industry as a reducing agent for ALD or CVD of metals. However, due to high aspect ratio structures, plasma uniformity is a concern for a conformal reduction mechanism. Accordingly, there is a need for new reducing agents with good volatility, a good reducing power and/or highly volatile reaction by products.

SUMMARY

One or more embodiments of the disclosure are directed to a method of forming a metal film, the method comprising exposing a metal halide film having the formula $MX_n$ to a reducing agent comprising a group IV element containing heterocyclic compound having the formula,

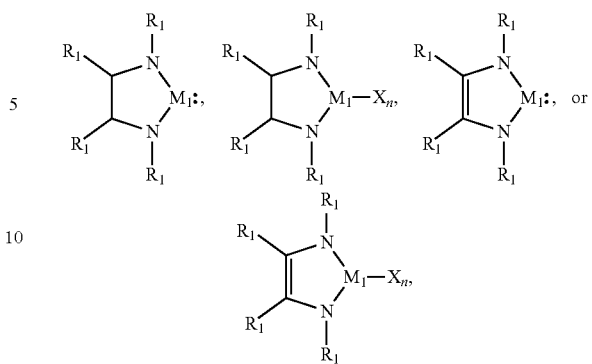

wherein, each of $R_1$, $R_2$, $R_3$ or $R_4$ are independently a C1-C6 alkyl, alkenyl or alkynyl group or C1-C8 cycloalkyl or aryl group, X is a halogen, n is number in a range of from 1 to 6, $M_1$ is selected from a group consisting of Si, Ge and Sn, and M comprises one or more of Si, Ge, Sn or C.

Another embodiments of the disclosure is directed to a method of forming a metal film, the method comprising exposing a metal halide film having the formula $MX_n$ to a reducing agent comprising a radical initiator having the formula $((R_2)_3Si)_3Si$—H and, where each $R_2$ are independently H, C1-C6 alkyl, alkenyl or alkynyl group or C1-C8 cycloalkyl or aryl group, a halogen, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, n is number in a range of from 1 to 6.

Another embodiment of the disclosure is directed to a method of forming a metal film, the method comprising exposing a metal halide film having the formula $MX_n$ to a reducing agent comprising an alkyl alane having the formula, $Al((R_3)_nH_{3-n})$, where each $R_3$ is independently selected from the group consisting of cyclohexyl, cyclopentyl or derivative thereof, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, n is number in a range of from 1 to 6, and each R does not have a hydrogen containing group.

Another embodiment of the disclosure is directed to a method of forming a metal film, the method comprising exposing a metal halide film having the formula $MX_n$ to a reducing agent comprising a diborene species having the formula

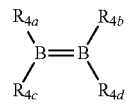

wherein, each of $R_{4a}$, $R_{4b}$, $R_{4c}$ and $R_{4d}$ are independently a C1-C6 alkyl group or a strong electron-donating group, the strong electron-donating group comprises one or more of an N-heterocyclic carbene, an alkyl silanes, an alkyl amides or an organic alcohol, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, and n is number in a range of from 1 to 6. Another embodiment of the disclosure is directed to a method of forming a metal film, the method comprising exposing a metal halide film having the formula $MX_n$ to a reducing agent comprising a Sn(II) compound to reduce the metal film and form Sn(IV)

compounds, wherein the Sn(II) compounds has a structure according to formula (X), (XI), (XII), (XIII) or (XIV),

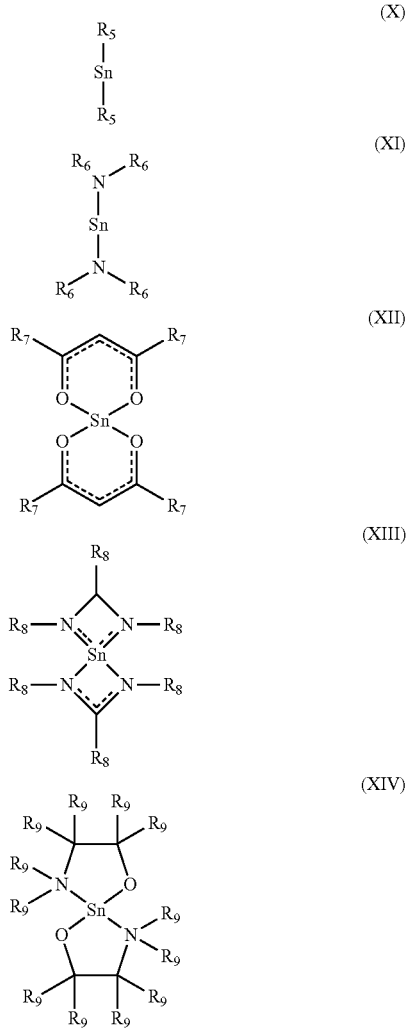

wherein, each of $R_5$ are independently selected from a group consisting of $C_p$, $C_p$* and $C_p$-$R_z$, where $R_z$ is a C1-C6 alkyl group and z is 1 to 5, wherein, each of $R_6$ are independently selected from a group consisting of Si(Me)$_3$, Me, Et, iPr and tBu, wherein, each of $R_7$ are independently selected from a group consisting of Me, CF$_3$ and tBu, wherein, each of $R_8$ are independently selected from a group consisting of Me, iPr and tBu, wherein, each of $R_9$ are independently selected from a group consisting of H, Me, iPr and tBu, and wherein M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, and n is number in a range of from 1 to 6.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 2A-2F illustrates exemplary reducing agents in accordance with one or more embodiments of the disclosure.

DETAILED DESCRIPTION

Figure 1:
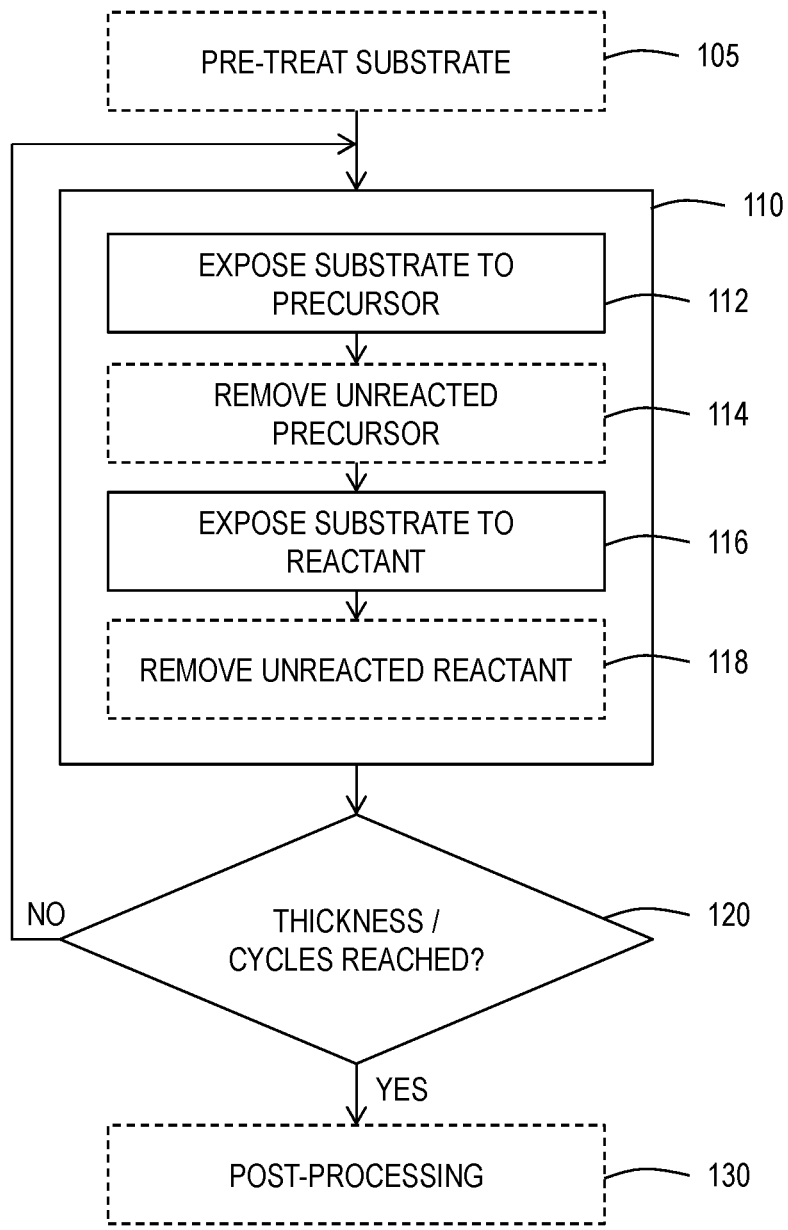
FIG. 1 shows a process flow diagram of a method in accordance with one or more embodiments of the disclosure.
Figure 2A:
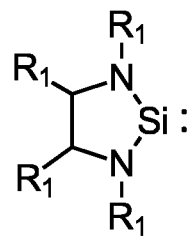
Figure 2B:
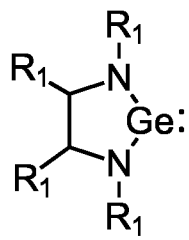
Figure 2B:
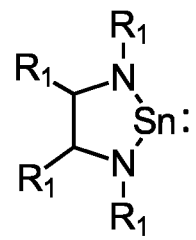
Figure 2D:
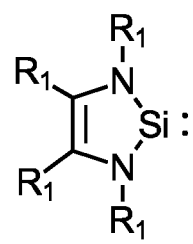
Figure 2E:
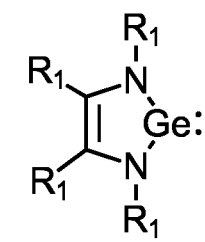
Figure 2F:
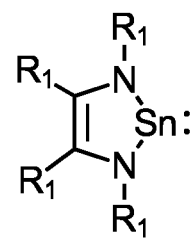

Before describing several exemplary embodiments of the disclosure, it is to be understood that the disclosure is not limited to the details of construction or process steps set forth in the following description. The disclosure is capable of other embodiments and of being practiced or being carried out in various ways.

Embodiments of the disclosure generally relate to methods of forming a film on a substrate surface. In particular, embodiments of the invention are directed to reducing agents and methods of forming the film that is substantially free of halogen and/or oxygen.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure describes a method of forming a film. The film comprises a metal film, a metal halide film or combination thereof. The method may be performed under atomic layer deposition (ALD), chemical vapor deposition (CVD) or combination thereof.

According to one or more embodiments, the method uses an atomic layer deposition (ALD) process. In such embodiments, the substrate surface having the film is exposed to the precursor and reactant sequentially or substantially sequentially. As used herein throughout the specification, "substantially sequentially" means that a majority of the duration of a precursor exposure does not overlap with the exposure to the reactant, although there may be some overlap.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, helium, nitrogen or combination thereof, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., reducing agent) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

With reference to FIG. 1, one or more embodiments of the disclosure are directed to method 100 of forming a film. The method illustrated in FIG. 1 is representative of a film deposition process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer.

At deposition 110, a process is performed to deposit a film on the substrate (or substrate surface). The deposition process can include one or more operations to form a film on the substrate. In operation 112, the substrate (or substrate surface) is exposed to a precursor to deposit a film on the substrate (or substrate surface). The precursor can be any suitable metal-containing compound that can react with (i.e., adsorb or chemisorb onto) the substrate surface to leave a metal-containing species on the substrate surface.

Halogen and carbonyl-based substituents are commonly used as precursors for depositing metallic films by ALD. Without intending to be bound by theory, it is thought that the presence of halogen and oxygen in the structure of film can pose challenges, as halogen and oxygen contamination may affect device performance. Hence reducing agent mediated halogen and/or oxygen abstraction can cure these film deposition defects.

In some embodiments, the film is substantially free of oxygen. In some embodiments, the film is substantially free of halogens. In some embodiments, the film is substantially free of oxygen and halogens. In some embodiments, the film is substantially free of oxygen and substantially free of halogens. As used herein, the term "substantially free" means that there is less than 5%, including less than 4%, less than 3%, less than 2%, less than 1%, and less than 0.5% of the stated species oxygen and/or halogen, on an atomic basis, in the metal film.

In one or more embodiments, the method comprises exposing the film having a formula $MX_n$ to a reducing agent, where M is a metal, X is a halogen and n is in the range of 1 to 6. In some embodiments, the "M" comprises a metal atom. In some embodiments, the metal atom comprises copper (Cu), cobalt (Co), ruthenium (Ru), molybdenum (Mo), silicon (Si), carbon (C), titanium (Ti), tantalum (Ta), tungsten (W), zirconium (Zr), hafnium (Hf), nickel (Ni), iron (Fe), chromium (Cr), manganese (Mn), aluminum (Al), germanium (Ge), tin (Sn) or combination thereof. In one or more embodiments, the "X" comprises a halogen atom. The halogen atom comprises fluorine (F), chlorine (Cl), bromine (Br) or iodine (I). In one or more embodiments, the "n" comprises a number in a range of from 1 to 6. In some embodiments, n is greater than or equal to 2, 3, 4 or 5.

At operation 114, the processing chamber is optionally purged to remove unreacted precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the precursor by any suitable technique including, but not limited to, moving the substrate through a gas curtain to a portion or sector of the processing chamber that contains none or substantially none of the precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He) or argon (Ar).

In one or more embodiments, the substrate (or substrate surface) is exposed to a reactant to deposit one or more of a film on the substrate. The reactant can react with the metal-containing species on the substrate surface to form the metal-containing film. In some embodiments, the reactant comprises a reducing agent. In one or more embodiments, the reducing agent can comprise any reducing agent known of to one of skill in the art. In other embodiments, the reactant comprises an oxidizing agent. In one or more embodiments, the oxidizing agent can comprise any oxidizing agent known to one of skill in the art. In further embodiments, the reactant comprises one or more oxidizing agent and a reducing agent. In some embodiments, the precursor is optionally purged before exposing the substrate (or substrate surface) to the reactant. In some embodiments, the reactant is optionally purged from the substrate (or substrate surface) before beginning the operation 116.

At operation 116, the substrate (or substrate surface) is exposed to a reactant to abstract halogen and/or oxygen from the film on the substrate. The reactant can react with the metal film on the substrate surface to form the metal film that is substantially free of oxygen and/or halogen. In some embodiments, the reactant comprises a reducing agent. In one or more embodiments, the reducing agent can comprise any reducing agent known of to one of skill in the art. In some embodiments, the reactant further comprises an oxidizing agent. In some embodiments, the operation 116 is performed at a temperature in a range of from 100° C. to 600° C., from 100° C. to 500° C., from 100° C. to 400° C., from 100° C. to 300° C., from 200° C. to 600° C., from 200° C. to 500° C., from 200° C. to 400° C., from 300° C. to 600° C. or from 300° C. to 500° C. In some embodiments, the operation 116 is performed at a pressure in a range of from 5 milliTorr to 500 Torr, 500 milliTorr to 500 Torr, 1 Torr to 500 Torr, 100 Torr to 500 Torr, from 5 milliTorr to 100 Torr, 500 milliTorr to 100 Torr or 1 Torr to 100 Torr. In some embodiments, the operation 116 is performed for a time in a range of from 0.1 sec to 5 min, from 1 sec to 5 min, from 1 min to 5 min, from 0.1 sec to 3 min, from 1 sec to 3 min, from 1 min to 3 min, from 0.1 sec to 1 min or from 1 sec to 1 min. In some embodiments, at operation 116, a carrier gas is used for exposing reactant to the substrate (or substrate surface). In some embodiments, the carrier gas is chemically inert. In some embodiments, the carrier gas comprises argon (Ar), helium (He), nitrogen ($N_2$) or combination thereof.

In one or more embodiments, the reducing agent comprises one or more of a group IV element containing heterocyclic compound having the formula (I)-(IV).

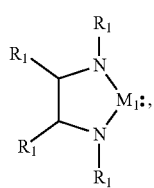

(I)

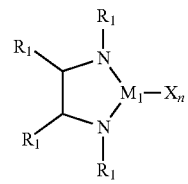

(II)

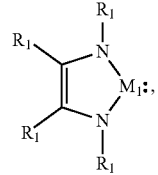

(III)

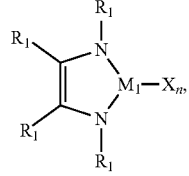

(IV)

In some embodiments, the each $R_1$ is independently a C1-C6 alkyl, a C1-C6 alkenyl, a C1-C6 alkynyl group, a C1-C8 cycloalkyl or a C1-C8 aryl group. In some embodiments, the "$M_1$" is selected from a group consisting of Si, Ge and Sn. In some embodiments, X is halogen comprising fluorine (F), chlorine (Cl), bromine (Br) and/or iodine (I). In some embodiments, n is a number in a range of from 1 to 4. In some embodiments, the reducing agent comprises a silylene, a germylene, a stanylene or combination thereof. In one or more embodiments, the reducing agent abstracts a halogen from the metal film. FIGS. 2A-2F shows exemplary group IV element containing heterocyclic reducing agents.

In one or more embodiments, the reducing agent comprises a radical initiator. In some embodiments, the radical initiator comprises a compound of the formula (V).

$$((R_2)_3Si)_3Si-H \qquad (V)$$

In some embodiments, each $R_2$ is independently a hydrogen (H), a C1-C6 alkyl, a C1-C6 alkenyl, a C1-C6 alkynyl group, a C1-C8 cycloalkyl, a C1-C8 aryl group or a halogen. In some embodiments, the radical initiator forms a radical compound thermally. In some embodiments, the radical compound is formed at a temperature in a range of from 50° C. to 600° C., from 50° C. to 500° C., from 50° C. to 400° C., from 50° C. to 300° C., from 100° C. to 600° C., from 100° C. to 500° C., from 100° C. to 400° C., from 100° C. to 300° C., from 200° C. to 600° C., from 200° C. to 500° C., from 200° C. to 400° C., from 300° C. to 600° C. or from 300° C. to 500° C. In some embodiments, the radical compound has a formula $((R_2)_3Si)_3Si\bullet$. In some embodiments, the radical initiator is in vapor phase. In some embodiments, a radical initiator vapor reacts with the metal halide in a CVD chamber. In some embodiments, the radical initiator vapor forms a radical vapor by a vapor phase radical initiation reaction. In some embodiments, the vapor phase radical reaction is thermally activated. In some embodiments, the radical initiator vapor is passed across a hotwire to form the radical vapor. In some embodiments, the hotwire is maintained at a temperature in a range of from 200° C. to 1600° C., from 200° C. to 1200° C., from 200° C. to 800°

C., from 200° C. to 400° C., from 500° C. to 1600° C., from 500° C. to 1200° C., from 500° C. to 800° C. or from 500° C. to 600 C.

In one or more embodiments, the reducing agent comprises an alkyl alane having the formula (VI).

(VI)

In some embodiments, each R in the alkyl alane reducing agent is independently selected from the group consisting of a cyclohexyl, a cyclopentyl or derivative thereof. In some embodiments, the alkyl alane does not have a hydrogen containing group. In some embodiments, the alkyl alane forms one or more of an aluminum or molybdenum film.

In some embodiments, each R in the alkyl alane reducing agent is independently a cyclohexyl or derivative thereof. In some embodiments, the cyclohexyl or derivative thereof has a formula —$C_6A_{10}$, where each of A is independently H or a C1-C4 group. In some embodiments, the cyclohexyl or derivative thereof is according to formula (VII), where each of A is independently H or alkyl C1-C4. In some embodiments, the carbon atom attached to the aluminum atom has a hydrogen atom.

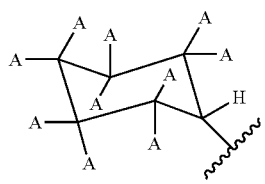

(VII)

In some embodiments, each R in the alkyl alane reducing agent is independently a cyclopentyl or derivative thereof. In some embodiments, the cyclopentyl or derivative thereof has a formula -$C_5A_8$, where each of A is independently H or a C1-C4 group. In some embodiments, the cyclopentyl or derivative thereof is according to formula (VIII), where each of A is independently H or an alkyl C1-C4. In some embodiments, the carbon atom attached to the aluminum atom has a hydrogen atom.

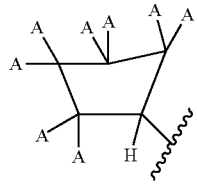

(VIII)

Figure 3:
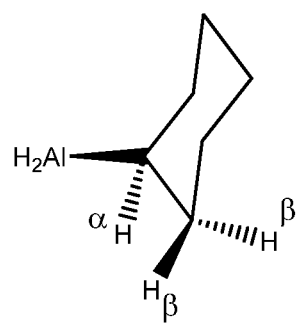
FIG. 3 illustrates exemplary reducing agent in accordance with one or more embodiments of the disclosure.

FIG. 3 shows an exemplary alklyl alane.

In one or more embodiments, the reducing agent comprises a diborene species having the formula (IX).

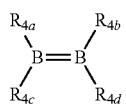

(IX)

In some embodiments, each of $R_{4a}$, $R_{4b}$, $R_{4c}$ and/or $R_{4d}$ are independently a C1-C6 alkyl group or a strong electron-donating group. Electron donor of an electron-donating group contributes an amount of electron density into a conjugated π system. The strength of this interaction is determined by a combination of both, resonance (mesomerism) and inductive effects (or induction). The stronger the electron-donating group, the more electron density is donated. In some embodiments, the strong electron-donating group comprises one or more of an N-heterocyclic carbene, an alkyl silane, an alkyl amide or an organic alcohol. In some embodiments, one or more of the $R_{4a}$ and $R_{4c}$ link to $R_{4b}$ and $R_{4d}$ respectively in a cyclic fashion. In some embodiments, the $R_{4a}$ links to $R_{4b}$ in a cyclic fashion. In some embodiments, the diborene compound has a large negative reduction potential. As used in this manner, a large negative reduction potential refers to a half-wave reduction potential ($E_{1/2}$) in a range of from −1.05 V to 1.55 V.

In one or more embodiments, the reducing agent comprises a Sn(II) compound. In some embodiments, the Sn(II) compound reduces the metal film to form Sn(IV) compounds. In some embodiments, the Sn(II) compound comprises a volatile, reactive and/or thermally stable compound. In some embodiments, the Sn(II) compounds has a structure according to formula (X), (XI), (XII), (XIII) or (XIV),

(X)

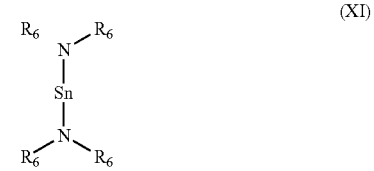

(XI)

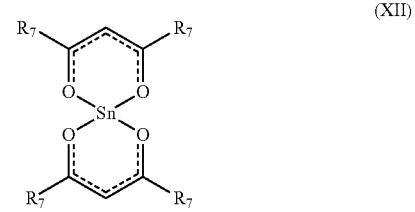

(XII)

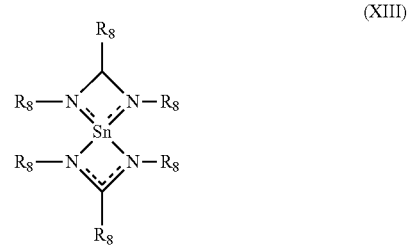

(XIII)

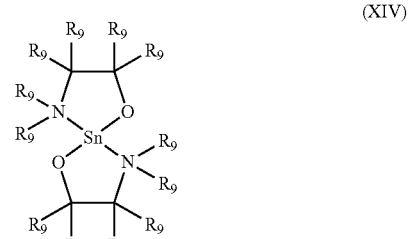

(XIV)

In some embodiments, the each $R_5$ of formula (X) is independently selected from a group consisting of cyclopentadiene ($C_p$), $C_p^*$ and/or $C_p\text{-}(R_p)_z$. In some embodiments, the $R_p$ is a C1-C6 alkyl group. In some embodiments, the z is in a range of from 1 to 5. In some embodiments, the each $R_6$ of formula (XI) is independently selected from a group consisting of trimethylsilyl ($Si(Me)_3$), methyl (Me), ethyl (Et), isopropyl (iPr) and/or tert-butyl (tBu). In some embodiments, the each $R_7$ of formula (XII) is independently selected from a group consisting of Me, trfluoromethyl ($CF_3$) and/or tBu. In some embodiments, the each $R_8$ of formula (XIII) is independently selected from a group consisting of Me, iPr and/or tBu. In some embodiments, the each $R_9$ of formula (XIV) is independently selected from a group consisting of hydrogen (H), Me, iPr and/or tBu.

At operation 118, the processing chamber is optionally purged after exposure to the reactant. Purging the processing chamber in operation 118 can be the same process or different process than the purge in operation 114. Purging the processing chamber, portion of the processing chamber, area adjacent the substrate surface, etc., removes unreacted reactant, reaction products and by-products from the area adjacent the substrate surface.

At decision 120, the thickness of the deposited film, or number of cycles of precursor and reactant is considered. If the deposited film has reached a predetermined thickness or a predetermined number of process cycles have been performed, the method 100 moves to an optional post-processing operation 130. If the thickness of the deposited film or the number of process cycles has not reached the predetermined threshold, the method 100 returns to operation 110 to expose the substrate surface to the precursor again in operation 112, and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of from 300° C. to 1000° C., from 400° C. to 1000° C., from 500° C. to 1000° C., from 600° C. to 1000° C., from 700° C. to 1000° C., from 800° C. to 1000° C. or from 900° C. or 1000 C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of from 15 seconds to 90 minutes, or in the range of from 1 minute to 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of from 10 W to 3000 W. In some embodiments, the plasma is generated with a plasma power less than or equal to 3000 W, less than or equal to 2000 W, less than or equal to 1000 W, less than or equal to 500 W, or less than or equal to 250 W.

The method 100 can be performed at any suitable temperature depending on, for example, the precursor, reactant or thermal budget of the device. In one or more embodiments, the use of high temperature processing may be undesirable for temperature-sensitive substrates, such as logic devices. In some embodiments, exposure to the precursor (operation 112) and the reactant (operation 116) occur at the same temperature. In some embodiments, the substrate is maintained at a temperature in a range of from 20° C. to 650, from 20° C. to 500° C., from 20° C. to 400° C., from 50° C. to 650° C., from 50° C. to 500° C. or from 50° C. to 400° C.

In some embodiments, exposure to the precursor (operation 112) occurs at a different temperature than the exposure to the reactant (operation 116). In some embodiments, the substrate is maintained at a first temperature in a range of from 20° C. to 650, from 20° C. to 500° C., from 20° C. to 400° C., from 50° C. to 650° C., from 50° C. to 500° C. or from 50° C. to 400° C., for the exposure to the precursor, and at a second temperature in the range of from 20° C. to 650, from 20° C. to 500° C., from 20° C. to 400° C., from 50° C. to 650° C., from 50° C. to 500° C. or from 50° C. to 400° C., for exposure the reactant.

In the embodiment illustrated in FIG. 1, at deposition operation 110 the substrate (or substrate surface) is exposed to the precursor and the reactant sequentially. In another, un-illustrated, embodiment, the substrate (or substrate surface) is exposed to the precursor and the reactant simultaneously in a CVD reaction. In a CVD reaction, the substrate (or substrate surface) can be exposed to a gaseous mixture of the precursor and reactant to deposit a metal film having a predetermined thickness. In the CVD reaction, the metal film can be deposited in one exposure to the mixed reactive gas, or can be multiple exposures to the mixed reactive gas with purges between.

In some embodiments, the metal film is formed by a CVD process. In the CVD reaction, the metal film is further exposed to the reducing agent. In some embodiments, the metal film is exposed to the reducing agent for a time period in a range of from 5 sec to 1 hour, from 1 min to 1 hour, from 10 min to 1 hour, from 20 min to 1 hour, from 40 min to 1 hour, from 5 sec to 40 min, from 1 min to 40 min, from 10 min to 40 min or from 20 min to 40 min. In some embodiments, the reducing agent comprises any of the reducing agent described in this disclosure or known to a one skilled in the art. In some embodiments, the metal film is exposed to the reducing agent at a temperature in a range of from 100° C. to 500° C., from 100° C. to 400° C., from 100° C. to 300° C., from 200° C. to 500° C., from 200° C. to 400° C. or from 300° C. to 500° C. In some embodiments, the metal film is exposed to the reducing agent cyclically with the metal deposition precursors. In some embodiments, the substrate surface is cyclically exposed to the precursor, the precursor reactant and the reducing agent with purges between. In some embodiments, the substrate surface is cyclically exposed to the precursor, the precursor reactant and the reducing agent for at least 1 to 10, at least 1 to 8, at least 1 to 5, at least 1 to 3, at least 3 to 10, at least 3 to 8, at least 3 to 5, at least 5 to 10, at least 5 or 8 or at least 8 to 10 cycles with purges between. In some embodiments, the substrate surface is cyclically exposed to the precursor, the precursor reactant and the reducing agent until the metal film has a thickness in a range of from 0.5 nm to 100 nm, from 1 nm to 100 nm, from 10 nm to 100 nm, from 25 nm to 100 nm, from 50 nm to 100 nm, from 0.5 nm to 50 nm, from 1 nm to 50 nm, from 10 nm to 50 nm, from 25 nm to 50 nm, from 0.5 nm to 25 nm, from 1 nm to 25 nm or from 10 nm to 25 nm with purges between.

In some embodiments, the metal film formed comprises elemental metal. In some embodiments, the metal film consists essentially of elemental metal. As used in this manner, the term "consists essentially of elemental metal" means that the metal film has greater than or equal to 80%, 85%, 90%, 95%, 98%, 99% or 99.5% of elemental metal on an atomic basis. Measurements of the composition of the metal film refer to the bulk portion of the film, excluding interface regions where diffusion of elements from adjacent films may occur.

One or more embodiments of the disclosure are directed to methods of depositing metal films in high aspect ratio features. A high aspect ratio feature is a trench, via or pillar having a height:width ratio greater than or equal to 10, 20, or 50, or more. In some embodiments, the metal film is deposited conformally on the high aspect ratio feature. As used in this manner, a conformal film has a thickness near the top of the feature that is in the range of 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom and a second material at the sidewalls. The metal film deposits selectively on the first material relative to the second material so that the metal film fills the feature in a bottom-up manner.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Embodiments

Various embodiments are listed below. It will be understood that the embodiments listed below may be combined with all aspects and other embodiments in accordance with the scope of the invention.

A first embodiment of the disclosure is directed to methods of forming a metal film, the method comprising exposing a metal halide film having the formula $MX_n$ to a reducing agent, the reducing agent comprising one or more of
a. a group IV element containing heterocyclic compound having the formula,

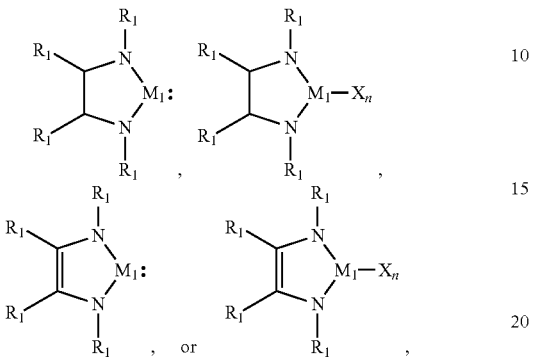

wherein, each of $R_1$ is independently a C1-C6 alkyl, alkenyl or alkynyl group or C1-C8 cycloalkyl or aryl group, X is a halogen, n is a number in a range of from 1 to 4, $M_1$ is selected from a group consisting of Si, Ge and Sn, and M comprises one or more of Si, Ge, Sn or C;
b. a radical initiator having a formula $((R_2)_3Si)_3Si-H$, where each $R_2$ is independently H, C1-C6 alkyl, alkenyl or alkynyl group or C1-C8 cycloalkyl or aryl group, a halogen;
c. an alkyl alane having the formula, $Al((R_3)_nH_{3-n})$, where each $R_3$ is independently selected from the group consisting of cyclohexyl, cyclopentyl or derivatives thereof, the cyclohexyl or derivative thereof has a formula $-C_6A_{10}$, the cyclopentyl or derivative thereof has a formula $-C_5A_8$, where each of a is independently H or a C1-C4 group;
d. a diborene species having the formula

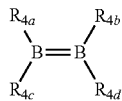

wherein, each of $R_{4a}$, $R_{4b}$, $R_{4c}$ and $R_{4d}$ are independently a C1-C6 alkyl group, or a strong electron-donating group, the strong electron-donating group comprises one or more of an N-heterocyclic carbene, an alkyl silane, an alkyl amide or an organic alcohol; or
e. a Sn(II) compound to reduce the metal film and form Sn(IV) compounds, wherein the Sn(II) compounds has a structure according to formula (X), (XI), (XII), (XIII) or (XIV),

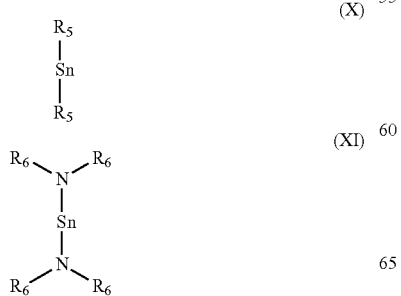

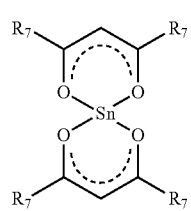

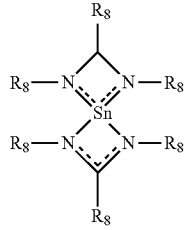

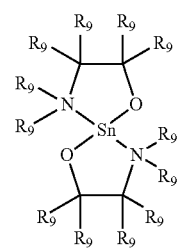

wherein, each of $R_5$ are independently selected from a group consisting of $C_p$, $C_p^*$ and $C_p$-$R_z$, where $R_z$ is a C1-C6 alkyl group and z is 1 to 5,
wherein, each of $R_6$ are independently selected from a group consisting of $Si(Me)_3$, Me, Et, iPr and tBu,
wherein, each of $R_7$ are independently selected from a group consisting of Me, $CF_3$ and tBu,
wherein, each of $R_8$ are independently selected from a group consisting of Me, iPr and tBu, and
wherein, each of $R_9$ are independently selected from a group consisting of H, Me, iPr and tBu.

A second embodiment of the disclosure modifies the first embodiment wherein the metal halide has a metal atom comprising one or more of Cu, Co, Ru, Mo, Si, C, Ti, Ta, W, Zr, Hf, Ni, Fe, Cr, Mn, Al or combination thereof.

A third embodiment of the disclosure modifies the first embodiment or second embodiment wherein the reducing agent (a) comprises a silylene.

A fourth embodiment of the disclosure modifies any of the first embodiment to third embodiment, wherein the reducing agent (a) comprises a germylene.

A fifth embodiment of the disclosure modifies any of the first embodiment through fourth embodiment, wherein the reducing agent (a) comprises a stannylene.

A sixth embodiment of the disclosure modifies any of the first through fifth embodiments, wherein the reducing agent (b) comprises radicals formed by a vapor phase radical initiation reaction.

A seventh embodiment of the disclosure modifies the sixth embodiment, wherein the vapor phase radical initiation reaction is thermally activated.

An eighth embodiment of the disclosure modifies the seventh embodiment, wherein the radicals are formed by passing a process gas across a hot wire at a temperature in the range of 500° C. to 600° C.

A ninth embodiment of the disclosure modifies any of the first through eighth embodiments, wherein exposure to the reducing agent (c) forms one or more of an aluminum or molybdenum film.

A tenth embodiment of the disclosure modifies any of the first through ninth embodiments, wherein the reducing agent (d) comprises a strong electron-donating group.

An eleventh embodiment of the disclosure modifies the tenth embodiment, wherein the strong electron-donating group comprises an N-heterocyclic carbene ligand.

A twelfth embodiment of the disclosure modifies the tenth embodiment, wherein the reducing agent comprises a diborene compound with a large negative reduction potential, the large negative reduction potential is in a range of from −1.05 V to 1.55 V.

A thirteenth embodiment of the disclosure modifies the tenth embodiment, wherein $R_{4a}$ and $R_{4b}$ link in a cyclic fashion.

A fourteenth embodiment of the disclosure modifies any of the first through thirteenth embodiments, wherein the reducing agent (e) comprises a volatile, reactive and/or thermally stable compound.

A fifteenth embodiment of the disclosure is directed to a method of forming a metal film, the method comprising exposing a metal halide film having the formula $MX_n$ to a reducing agent comprising a group IV element containing heterocyclic compound having the formula,

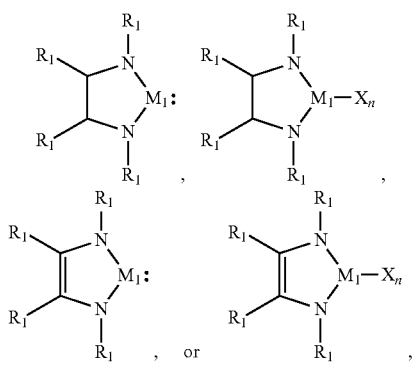

wherein, each of $R_1$, $R_2$, $R_3$ or $R_4$ are independently a C1-C6 alkyl, alkenyl or alkynyl group or C1-C8 cycloalkyl or aryl group, X is a halogen, n is number in a range of from 1 to 6, $M_1$ is selected from a group consisting of Si, Ge and Sn, and M comprises one or more of Si, Ge, Sn or C.

A sixteenth embodiment of the disclosure is directed to a method of forming a metal film, the method comprising exposing a metal halide film having the formula $MX_n$ to a reducing agent comprising a radical initiator having the formula $((R_2)_3Si)_3Si$—H and, where each $R_2$ are independently H, C1-C6 alkyl, alkenyl or alkynyl group or C1-C8 cycloalkyl or aryl group, a halogen, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, n is number in a range of from 1 to 6.

A seventeenth embodiment of the disclosure is directed to a method of forming a metal film, the method comprising exposing a metal halide film having the formula $MX_n$ to a reducing agent comprising an alkyl alane having the formula, $Al((R_3)_nH_{3-n})$, where each $R_3$ is independently selected from the group consisting of cyclohexyl, cyclopentyl or derivative thereof, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, n is number in a range of from 1 to 6, and each R does not have a hydrogen containing group.

An eighteenth embodiment of the disclosure modifies the seventeenth embodiment, wherein the cyclohexyl or derivative thereof has a formula —$C_6A_{10}$, wherein each of A is independently H or alkyl C1-C4.

A nineteenth embodiment of the disclosure modifies the seventeenth embodiment, wherein the cyclopentyl or derivative thereof has a formula —$C_5A_8$, wherein each of A is independently H or alkyl C1-C4.

A twentieth embodiment of the disclosure modifies the seventeenth embodiment, wherein the cyclohexyl or derivative thereof has a structure according to formula (VII), wherein each of A is independently H or alkyl C1-C4.

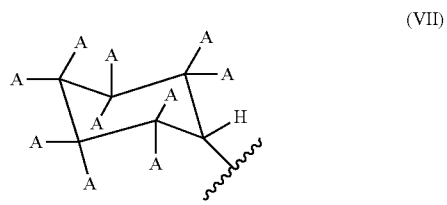

A twenty first embodiment of the disclosure modifies the seventeenth embodiment, wherein the cyclopentyl or derivative thereof has a structure according to formula (VIII), wherein each of A is independently H or alkyl C1-C4.

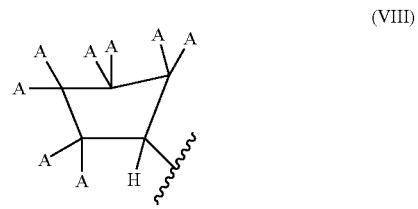

A twenty second embodiment of the disclosure is directed to a method of forming a metal film, the method comprising exposing a metal halide film having the formula $MX_n$ to a reducing agent comprising a diborene species having the formula (IX)

wherein, each of $R_{4a}$, $R_{4b}$, $R_{4c}$ and $R_{4d}$ are independently a C1-C6 alkyl group or a strong electron-donating group, the strong electron-donating group comprises one or more of an N-heterocyclic carbene, an alkyl silanes, an alkyl amides or an organic alcohol, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, and n is number in a range of from 1 to 6.

A twenty third embodiment of the disclosure is directed to a method of forming a metal film, the method comprising exposing a metal halide film having the formula $MX_n$ to a reducing agent comprising a Sn(II) compound to reduce the metal film and form Sn(IV) compounds, wherein the Sn(II) compounds has a structure according to formula (X), (XI), (XII), (XIII) or (XIV),

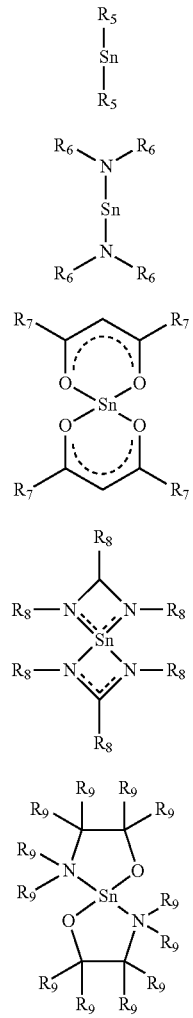

wherein, each of $R_5$ are independently selected from a group consisting of $C_p$, $C_p^*$ and $C_p$-$R_z$, where $R_z$ is a C1-C6 alkyl group and z is 1 to 5,
wherein, each of $R_6$ are independently selected from a group consisting of Si(Me)$_3$, Me, Et, iPr and tBu,
wherein, each of $R_7$ are independently selected from a group consisting of Me, CF$_3$ and tBu,
wherein, each of $R_8$ are independently selected from a group consisting of Me, iPr and tBu,
wherein, each of $R_9$ are independently selected from a group consisting of H, Me, iPr and tBu, and
wherein M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, and n is number in a range of from 1 to 6

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

While the foregoing is directed to embodiments of the present disclosure, other and further embodiments of the disclosure may be devised without departing from the basic scope thereof, and the scope thereof is determined by the claims that follow.

What is claimed is:
1. A method of forming a metal film, the method comprising exposing a metal halide film to a reducing agent, the reducing agent comprising one or more of
   a. a group IV element containing heterocyclic compound having the formula,

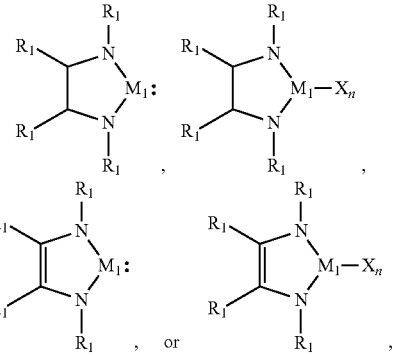

wherein, each of $R_1$ is independently a C1-C6 alkyl, alkenyl or alkynyl group or C1-C8 cycloalkyl or aryl group, X is a halogen, n is a number in a range of from 1 to 4, $M_1$ is selected from a group consisting of Ge and Sn;
   b. a radical initiator having a formula $((R_2)_3Si)_3Si-H$, where each $R_2$ is independently H, C1-C6 alkyl, alkenyl or alkynyl group or C1-C8 cycloalkyl or aryl group, a halogen;
   c. a diborene species having the formula

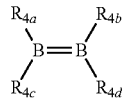

wherein, each of $R_{4a}$, $R_{4b}$, $R_{4c}$ and $R_{4d}$ are independently a C1-C6 alkyl group, or a strong electron-donating group, the strong electron-donating group comprises one or more of an N-heterocyclic carbene, an alkyl silane, an alkyl amide or an organic alcohol; or
   d. a Sn(II) compound to reduce the metal film and form Sn(IV) compounds, wherein the Sn(II) compounds has a structure according to formula (X), (XI), (XII), (XIII) or (XIV),

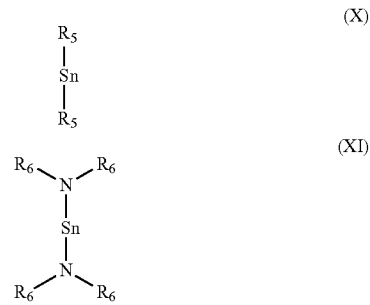

-continued

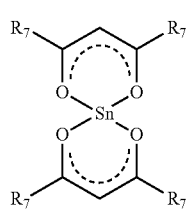
(XII)

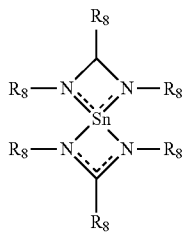
(XIII)

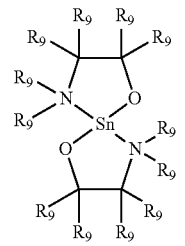
(XIV)

wherein, each of $R_5$ are independently selected from a group consisting of Cp, Cp* and $C_p$-$R_z$, where $R_z$ is a C1-C6 alkyl group and z is 1 to 5, wherein, each of $R_6$ are independently selected from a group consisting of Si(Me)$_3$, Me, Et, iPr and tBu, wherein, each of $R_7$ are independently selected from a group consisting of Me, CF$_3$ and tBu, wherein, each of $R_8$ are independently selected from a group consisting of Me, iPr and tBu, and wherein, each of $R_9$ are independently selected from a group consisting of H, Me, iPr and tBu.

2. The method of claim 1, wherein the metal halide has a metal atom comprising one or more of Cu, Co, Ru, Mo, Si, C, Ti, Ta, W, Zr, Hf, Ni, Fe, Cr, Mn, Al or combination thereof.

3. The method of claim 1, wherein the reducing agent (a) comprises a germylene.

4. The method of claim 1, wherein the reducing agent (a) comprises a stannylene.

5. The method of claim 1, wherein the reducing agent (b) comprises radicals formed by a vapor phase radical initiation reaction.

6. The method of claim 5, wherein the vapor phase radical initiation reaction is thermally activated.

7. The method of claim 6, wherein the radical are formed by passing a process gas across a hot wire at a temperature in the range of 500° C. to 600° C.

8. The method of claim 1, wherein the reducing agent (c) comprises a strong electron-donating group.

9. The method of claim 8, wherein the strong electron-donating group comprises an N-heterocyclic carbene ligand.

10. The method of claim 8, wherein the reducing agent comprises a diborene compound with a large negative reduction potential, the large negative reduction potential is in a range of from −1.05 V to 1.55 V.

11. The method of claim 8, wherein $R_{4a}$ and $R_{4b}$ link in a cyclic fashion.

12. The method of claim 1, wherein the reducing agent (d) comprises a volatile, reactive and/or thermally stable compound.

13. A method of forming a metal film, the method comprising exposing a metal halide film having the formula $MX_n$ to a reducing agent comprising a radical initiator having the formula $((R_2)_3Si)_3Si$-H and, where each $R_2$ are independently H, C1-C6 alkyl, alkenyl or alkynyl group or C1-C8 cycloalkyl or aryl group, a halogen, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, n is number in a range of from 1 to 6, or a reducing agent comprising an alkyl alane having the formula, $Al((R_3)_nH_{3-n})$, where each $R_3$ is independently selected from the group consisting of cyclohexyl, cyclopentyl or derivative thereof, M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, n is number in a range of from 1 to 6, and each R does not have a hydrogen containing group, wherein the reducing agent comprises radicals formed by a vapor phase radical initiation reaction.

14. The method of claim 13, wherein the cyclohexyl or derivative thereof has a structure according to formula (VII), wherein each of A is independently H or alkyl C1-C4; or the cyclopentyl or derivative thereof has a structure according to formula (VIII), wherein each of A is independently H or alkyl C1-C4.

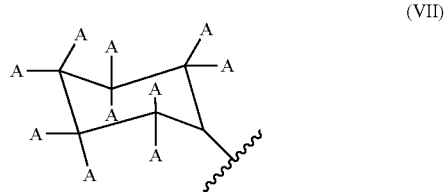
(VII)

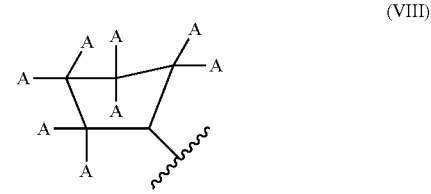
(VIII)

15. The method of claim 13, wherein the radical are formed by passing a process gas across a hot wire at a temperature in the range of 500° ° C. to 600° C.

16. A method of forming a metal film, the method comprising exposing a metal halide film having the formula $MX_n$ to a reducing agent comprising a Sn(II) compound to reduce the metal film and form Sn(IV) compounds, wherein the Sn(II) compounds has a structure according to formula (X), (XI), (XII), (XIII) or (XIV),

(X)

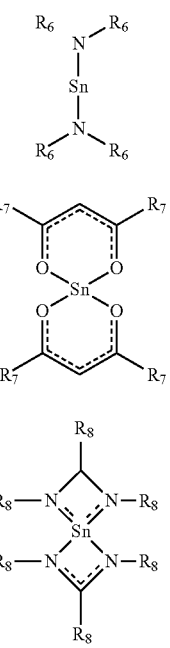

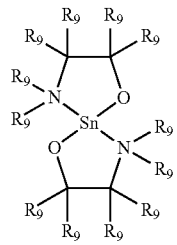

wherein, each of $R_5$ are independently selected from a group consisting of Cp, Cp* and $C_p$-$R_z$, where $R_z$ is a C1-C6 alkyl group and z is 1 to 5, wherein, each of $R_6$ are independently selected from a group consisting of $Si(Me)_3$, Me, Et, iPr and tBu, wherein, each of $R_7$ are independently selected from a group consisting of Me, $CF_3$ and tBu, wherein, each of $R_8$ are independently selected from a group consisting of Me, iPr and tBu, wherein, each of $R_9$ are independently selected from a group consisting of H, Me, iPr and tBu, and wherein M comprises a metal atom, silicon atom or carbon atom, Cu, Co, Ru, Mo, Si, C, Ti, Ta, W, Zr, Hf, Ni, Fe, Cr, Mn, Al or combination thereof, X is a halogen, and n is number in a range of from 1 to 6.

* * * * *